United States Patent
Issaq et al.

(10) Patent No.: US 6,728,126 B1
(45) Date of Patent: Apr. 27, 2004

(54) PROGRAMMING METHODS FOR AN AMORPHOUS CARBON METAL-TO-METAL ANTIFUSE

(75) Inventors: A. Farid Issaq, Campbell, CA (US); Frank Hawley, Campbell, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 10/327,675

(22) Filed: Dec. 20, 2002

(51) Int. Cl.⁷ .................. G11C 17/00; H01H 37/76; H01H 85/00
(52) U.S. Cl. .................. 365/96; 365/225.7; 327/525
(58) Field of Search .................. 365/96, 225.7; 327/525

(56) References Cited

U.S. PATENT DOCUMENTS

| | | | |
|---|---|---|---|
| 4,442,507 A | 4/1984 | Roesner | 365/100 |
| 4,543,594 A | 9/1985 | Mohsen et al. | 357/51 |
| 4,823,181 A | 4/1989 | Mohsen et al. | 357/51 |
| 4,881,114 A | 11/1989 | Mohsen et al. | 357/54 |
| 4,899,205 A | 2/1990 | Hamdy et al. | 357/51 |
| 5,008,855 A * | 4/1991 | Eltoukhy et al. | 365/96 |
| 5,070,384 A | 12/1991 | McCollum et al. | 357/51 |
| 5,126,282 A * | 6/1992 | Chiang et al. | 438/467 |
| 5,171,715 A | 12/1992 | Husher et al. | 437/195 |
| 5,181,096 A | 1/1993 | Forouhi | 257/530 |
| 5,196,724 A | 3/1993 | Gordon et al. | 257/530 |
| 5,272,101 A | 12/1993 | Forouhi et al. | 437/50 |
| 5,308,795 A | 5/1994 | Hawley et al. | 437/195 |
| 5,365,104 A | 11/1994 | Godinho et al. | 257/529 |
| 5,411,917 A | 5/1995 | Forouhi et al. | 437/195 |
| 5,576,576 A | 11/1996 | Hawley et al. | 257/530 |
| 5,592,016 A | 1/1997 | Go et al. | 257/530 |
| 5,763,898 A | 6/1998 | Forouhi et al. | 257/50 |
| 5,780,323 A | 7/1998 | Forouhi et al. | 438/131 |
| 5,789,764 A | 8/1998 | McCollum | 257/76 |
| 6,114,714 A | 9/2000 | Gangopadhyay | 257/50 |
| 6,437,365 B1 | 8/2002 | Hawley et al. | 257/50 |
| 6,529,038 B2 * | 3/2003 | Lambertson | 326/38 |
| 2002/0100907 A1 | 8/2002 | Wang | 257/50 |

FOREIGN PATENT DOCUMENTS

| | | | |
|---|---|---|---|
| EP | 0 250 078 A2 | 12/1987 | H01L/23/52 |
| EP | 0 671 767 A2 | 9/1995 | H01L/23/525 |
| EP | 0 671 767 A3 | 1/1998 | |
| JP | 60-242678 A | 12/1985 | H01L/29/78 |
| JP | 60-295991 A | 10/1994 | H01L/27/10 |
| WO | WO 92/21154 | 11/1992 | H01L/45/00 |

* cited by examiner

Primary Examiner—VanThu Nguyen
(74) Attorney, Agent, or Firm—Sierra Patent Group, Ltd.

(57) ABSTRACT

In a first embodiment, programming pulses of about 0.25 mA to about 0.5 mA are applied to an amorphous carbon based antifuse in first and second directions for 10 us to form an antifuse link having a finite resistance of less than 2000 ohms. Soaking pulses of about 2 mA to about 5 mA are then applied to the amorphous carbon antifuse in first and second directions for 1 ms and then repeated up to four more times to form an antifuse link with a finite resistance of about 100 ohms to about 400 ohms. In a second embodiment, programming pulses of about 0.25 mA to about 0.5 mA are applied to an amorphous carbon based antifuse in first and second directions for 1 ms and then repeated four more times to form an antifuse link having a finite resistance of less than 2000 ohms. Soaking pulses of about 2 mA to about 5 mA are then applied to the amorphous carbon antifuse in first and second directions for 1 ms and then repeated up to four more times to form an antifuse link with a finite resistance of about 100 ohms to about 400 ohms.

9 Claims, 3 Drawing Sheets

PROGRAMMING METHODS FOR AN AMORPHOUS CARBON METAL-TO-METAL ANTIFUSE

BACKGROUND OF THE INVENTION

1. Field of the Invention

The present invention relates to programming metal-to-metal antifuse structures. More particularly, the present invention relates to methods for programming amorphous carbon metal-to-metal antifuse structures.

2. The Background Art

Antifuses are devices which generally comprise a pair of conductive electrodes sandwiched about an insulating antifuse material layer. Prior to programming, an antifuse element is an open circuit that exhibits a resistance of a few gigaohms. A programming process disrupts the antifuse material and forms a filament between the two electrodes which creates a low-impedance connection of a few ohms to a few thousand ohms between the two electrodes. Programming voltages range from a few volts to about 20 volts.

Metal-to-metal antifuses are well known in the art. Under specific conditions where excessive current is placed across a programmed antifuse, it is known that metal-to-metal antifuses will exhibit a phenomenon wherein the antifuse will revert to its off state through the destruction of the conductive filament. This failure mode often manifests itself after a period of time during which the antifuse links appear to have been properly formed. This failure mode is commonly known as "read disturb" because the excessive parasitic current occurs during the read state of the antifuse.

One factor which contributes to read disturb is the presence of any significant quantity of aluminum in the antifuse conductive links due to electromigration of the aluminum. Metal Barrier layers which serve to block aluminum flow into the antifuse material layer of various materials and various thicknesses have been proposed. The barrier materials, between the aluminum and the amorphous silicon, provide essentially all of the conductive material forming the conductive filament in the programmed antifuse. An antifuse formed with such a barrier metal link material can tolerate more current and have a higher reliability than an antifuse formed without the barrier metal link material.

To minimize read disturb, methods of antifuse programming have also been devised. In one proposed method, the direction of the antifuse programming is implemented such that a series of asymmetrical programming pulses having an amplitude in one direction greater than the amplitude in the other direction is applied so that the antifuse is more likely to program during the greater pulse. If it fails to program on the first greater pulse, it probably won't program on the first lesser pulse and will likely program on a subsequent greater pulse. In this way it can be assured that the antifuse will only disrupt while the current is flowing in one particular and predetermined direction.

In another method, the programming current is increased to a level which is much greater than the operating current. With high programming current, more power is generated during formation of the conductive filament, resulting in a filament having a larger diameter. This provides immunity from major material transport inside the conductive filament, because for the same operating current, the current density will be lower. This is essentially the approach currently taken in programming amorphous silicon metal-to-metal antifuses.

It is generally accepted that amorphous silicon metal-to-metal antifuses have a known switching phenomenon corresponding to a ratio of read current to programming current of about 0.8 (switching ratio) which requires strict adherence to two design rules. First, for nodes with enough programmed antifuses to be considered heavily loaded, the subsequent high operating current requires that a high programming current be employed. As a result, larger transistors which add to the die size, are required to provide the higher programming current. Second, amorphous silicon metal-to-metal antifuses have a minimum required programming current of greater than 5 mA to maintain a stable resistance. Below 5 mA, the programmed antifuse resistance is non-linear, and creates a diode-like effect.

BRIEF DESCRIPTION OF THE INVENTION

In an embodiment of the present invention, a first low programming current pulse is applied to an antifuse in a first direction for a predetermined amount of time followed by a second low programming current pulse applied to the antifuse in the opposite direction. A high soaking current pulse is then applied to the antifuse in the first direction for a predetermined amount of time followed by a second low programming current pulse applied to the antifuse in the opposite direction for a predetermined amount of time. The method generally of low current followed by a higher current provides a relatively lower and tighter distribution of antifuse resistance than a high programming current followed by a high soaking current.

DETAILED DESCRIPTION OF A PREFERRED EMBODIMENT

Figure 1:
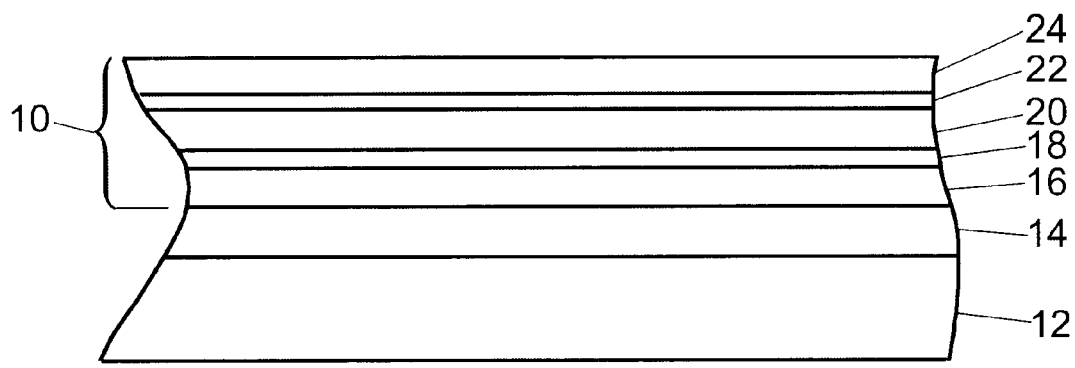
FIG. 1 illustrates schematically in a cross-sectional view an antifuse suitable for programming according to the present invention.

Those of ordinary skill in the art will realize that the following description of the present invention is illustrative only and not in any way limiting. Other embodiments of the invention will readily suggest themselves to such skilled persons.

The antifuse programming method of the present invention may be implemented on an antifuse of the type described in U.S. patent application Ser. No. 10/331,144 filed on Dec. 27, 2002 by inventors Frank Hawley, Farid Issaq, John McCollum, Shubhra Gangopadhyay, Jorge Lungbaun, and Jin Miao Shen, entitled "METAL-TO-METAL ANTIFUSE EMPLOYING CARBON CONTAINING ANTIFUSE MATERIAL", having attorney docket No. ACT-364. The antifuse in this example is disposed above a semiconductor substrate with an intervening insulating layer. The antifuse has a lower electrode, a lower adhesion layer, an antifuse material layer, an upper adhesion layer, and an upper electrode. The antifuse material layer is preferably amorphous carbon (a-C), and the lower and upper adhesion layers are employed to adhere the a-C antifuse material layer to the lower and upper electrodes, respectively.

In a first embodiment according to the present invention, a programming pulse of about 0.25 mA to about 0.5 mA is applied to an antifuse in a first direction for 10 us. Next, a programming pulse of about 0.25 mA to about 0.5 mA is applied to the antifuse in a second direction for 10 us. This will form an antifuse link having a finite resistance of less than 2000 ohms. To achieve an antifuse with a finite resistance of about 100 ohms to about 400 ohms, an additional soaking pulse of about 2 mA to about 5 mA is applied to the antifuse in a first direction for 1 ms, and an additional soaking pulse of about 2 mA to about 5 mA is applied to the antifuse in a second direction for 1 ms. The sequence of soaking pulses may be repeated up to four more times.

In a second embodiment according to the present invention, a programming pulse of about 0.25 mA to about 0.5 mA is applied to an antifuse in a first direction for 1 ms. Next, a programming pulse of about 0.25 mA to about 0.5 mA is applied to the antifuse in a second direction for 1 ms. This sequence of programming pulses is repeated four more times to form an antifuse link having a finite resistance of less than 2000 ohms. To achieve an antifuse with a finite resistance of about 100 ohms to about 400 ohms, an additional soaking pulse of about 2 mA to about 5 mA is applied to the antifuse in a first direction for 1 ms, and an additional soaking pulse of about 2 mA to about 5 mA is applied to the antifuse in a second direction for 1 ms. The sequence of soaking pulses may be repeated up to four more times.

One of the main advantages of metal-to-metal antifuses is that they may be disposed over an active region of a semiconductor substrate rather than in the active region. This provides for much greater circuit density in the active region of the substrate, however, programming an antifuse placed above the active region must be accomplished without damaging the circuits in the active region.

By programming the metal-to-metal antifuse according to the present invention, the amount of energy used in the programming process achieves a reduction in the heating of the aluminum metallization layer to minimize the likelihood that aluminum will migrate into the conductive links of the antifuse itself or damage the aluminum by melting or migrating the aluminum away from the antifuse and causing a disconnect in the interconnect aluminum line. This is a significant advantage over programming methods which address the read disturb problem by raising the magnitude of the programming current.

Antifuses according to the present invention are programmed using programming pulses of current that are substantially lower in both magnitude and duration than those of the prior art, and provide links of lower resistance and with less read disturb than amorphous silicon metal-to-metal antifuses. The antifuses can be programmed with current pulses of about 0.25 mA to about 0.5 mA for as short as 10 us to achieve a very stable antifuse resistance of less than 2000 ohms, and then soaked with current pulses of about 2 mA to about 5 mA to achieve a very stable antifuse resistance of about 100 to about 400 ohms. The reduction in programming current permits the use of smaller programming current transistors which helps to reduce die size. In FIG. 1, an antifuse 10 suitable for programming according to the present invention is depicted schematically in a cross-sectional view. The antifuse 10 is disposed above a semiconductor substrate 12 with an intervening insulating layer 14. The antifuse 10 has a lower electrode 16, a thin lower adhesion layer 18, an antifuse material layer 20, a thin upper adhesion layer 22, and an upper electrode 24. According to the present invention, the antifuse material layer 20 is preferably amorphous carbon (a-C), and the lower and upper adhesion layers 18 and 22, respectively, are employed to adhere the a-C antifuse material layer 20 to the lower and upper electrodes 16 and 24, respectively. It is believed that the present invention is also useful for programming other types of antifuses.

To avoid overcomplicating the disclosure and thereby obscuring the present invention, a detailed description of the antifuse depicted schematically in FIG. 1 is not made herein. Such a description is disclosed in U.S. patent application Ser. No. 10/331,144 filed on Dec. 27, 2002 by inventors Frank Hawley, Farid Issaq, John McCollum, Shubhra Gangopadhyay, Jorge Lungbaun, and Jin Miao Shen, entitled "METAL-TO-METAL ANTIFUSE EMPLOYING CARBON CONTAINING ANTIFUSE MATERIAL", having attorney docket No. ACT-364, and hereby incorporated by reference.

Figure 2:
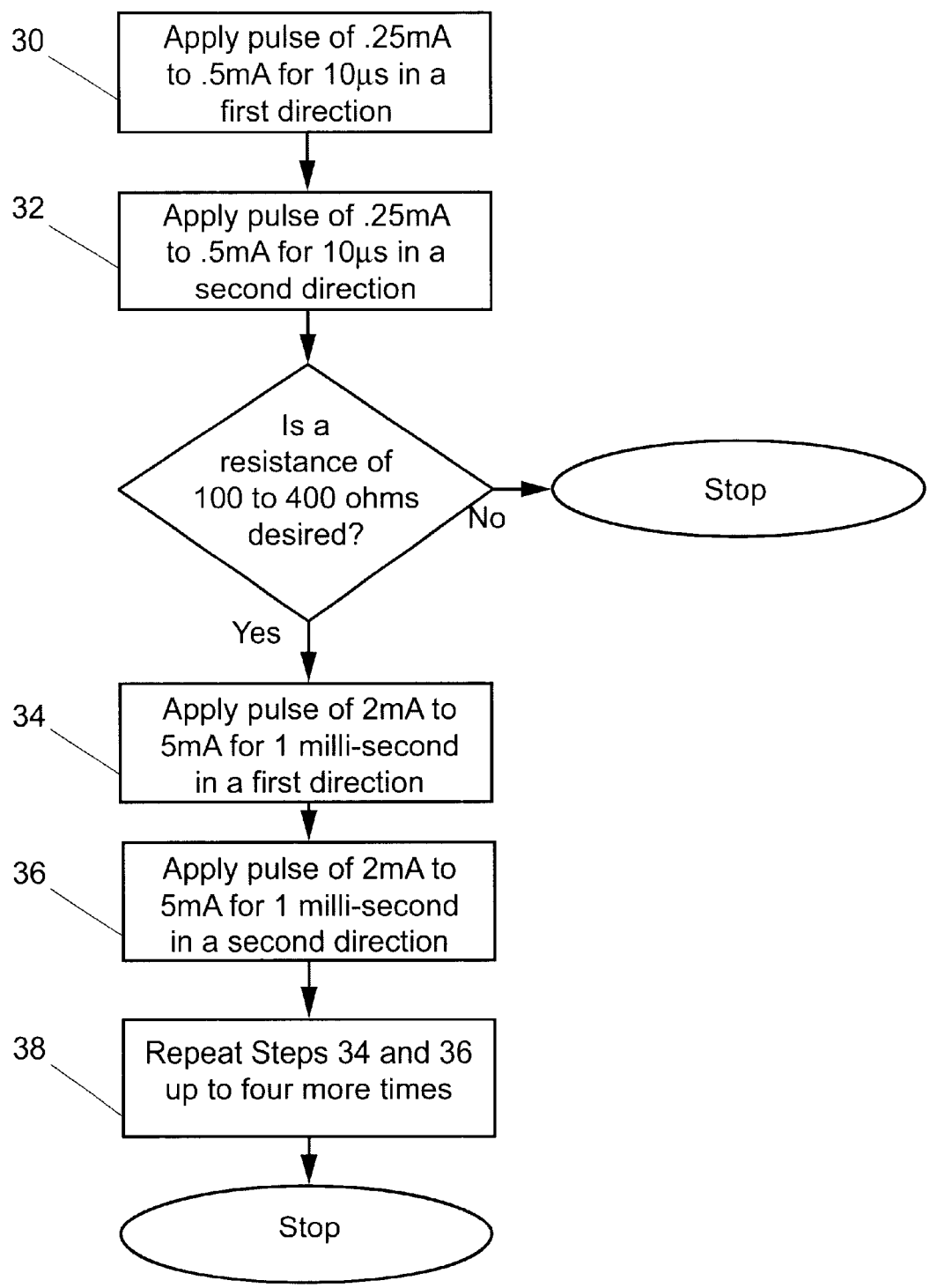
FIG. 2 is a flow diagram illustrating the steps of a first embodiment of antifuse programming according to the present invention.

FIG. 2 is a flow diagram illustrating the steps of a first embodiment according to the present invention. First, at programming step 30, a pulse of about 0.25 mA to about 0.5 mA is applied to an antifuse in a first direction for 10 us. Next, at programming step 32, a pulse of about 0.25 mA to about 0.5 mA is applied to the antifuse in a second direction for 10 us. For the type of antifuse shown in FIG. 1, this has been shown to form an antifuse link having a finite resistance of less than 2000 ohms. If an antifuse with a finite resistance of less than 100 ohms to about 400 ohms is desired, at soaking step 34, a pulse of about 2 mA to about 5 mA is applied to the antifuse in a first direction for 1 ms, and at soaking step 36, a pulse of about 2 mA to about 5 mA is applied to the antifuse in a second direction for 1 ms. At soaking step 38, the sequence of steps 34 and 36 may be repeated (for example, up to four more times). Repeating the sequence of soaking steps 34 and 36 helps to reduce the distribution range of programmed antifuse resistances.

In the soaking steps 34 and 36, when the pulses are about 2 mA for the fuse shown in FIG. 1, the fuse resistance has a range of about 100 ohms to about 400 ohms, when the pulses are about 3 mA, the fuse resistance has a range of about 100 ohms to about 300 ohms, and when the pulses are about 5 mA, the fuse resistance has a range of about 100 ohms to about 200 ohms for the fuse shown in FIG. 1. Applying pulses in steps soaking 34 and 36 of greater than 6 mA may create an unstable state in the antifuse link.

Typically, antifuse resistance decreases with additional current stress, however, presently it has been found that the application of current in a range of about 7 mA to about 10 mA results in antifuses having a distribution of resistances which is greater than that for a 5 mA pulse. An increase in current beyond this range again causes a decrease in antifuse resistance. It is believed that the programmed resistance for currents of about 6 mA or less as described is due to a phase change in the material, and that for currents greater than 10 mA, the programmed resistance is due to the flow of metal in the antifuse link. It should be appreciated that a 10 us pulse width in comparison to a 1 ms pulse width requires a programming voltage that is about 1V to about 1.5V greater than the breakdown voltage.

Figure 3:
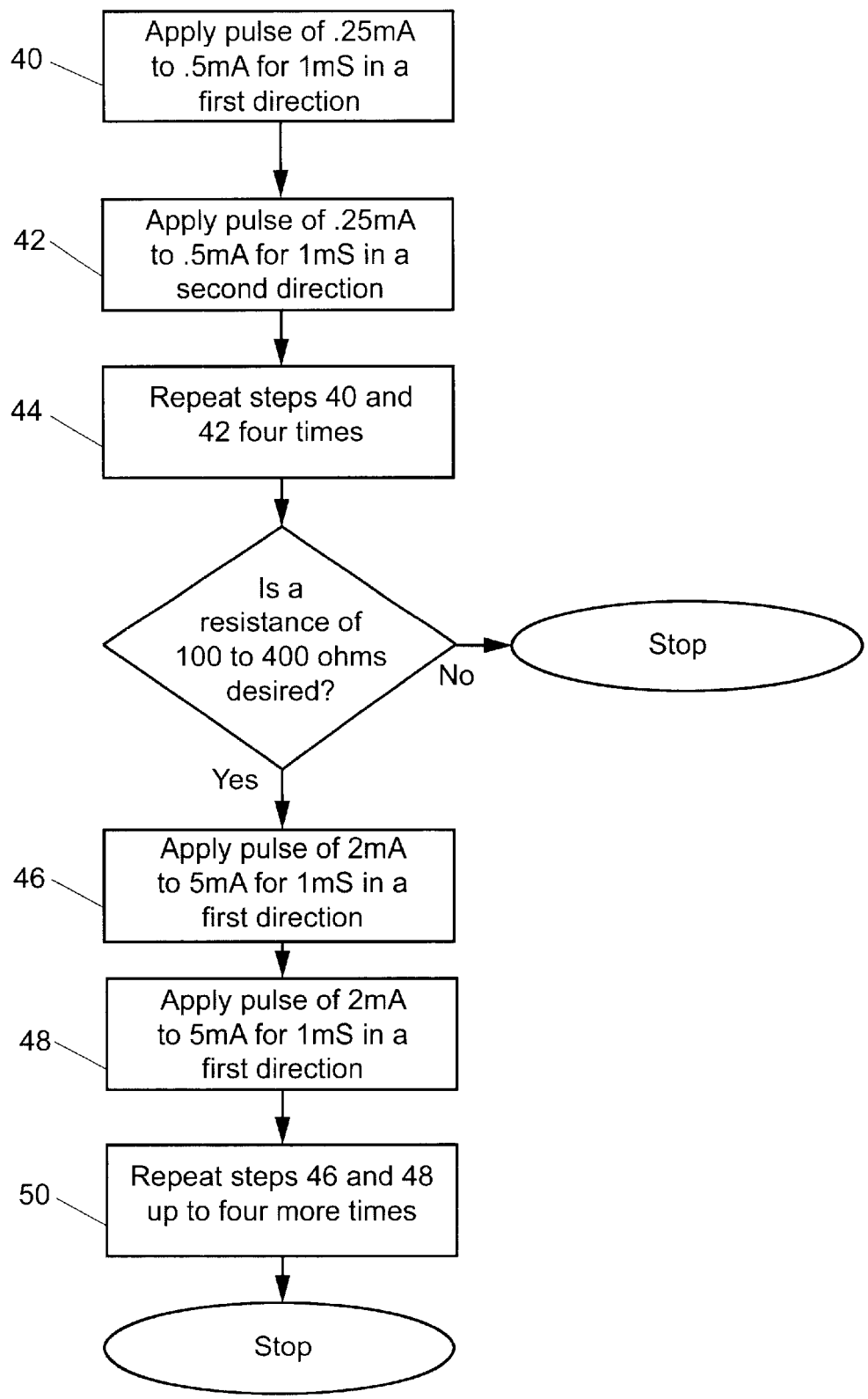
FIG. 3 is a flow diagram illustrating the steps of a second embodiment of antifuse programming according to the present invention.

FIG. 3 is a flow diagram illustrating the steps of a second embodiment according to the present invention. First, at programming step 40, a pulse of about 0.25 mA to about 0.5 mA is applied to an antifuse in a first direction for 1 ms. Next, at programming step 42, a pulse of about 0.25 mA to about 0.5 mA is applied to the antifuse in a second direction for 1 ms. At programming step 44, the sequence of steps 40 and 42 is repeated a desired number of times (for example four more times). For the antifuse shown in FIG. 1, this will form an antifuse link having a finite resistance of less than 2000 ohms. If an antifuse with a finite resistance of about 100 ohms to about 400 ohms is desired, at soaking step 46, a pulse of about 2 mA to about 5 mA is applied to the antifuse in a first direction for 1 ms, and at soaking step 48, a pulse of about 2 mA to about 5 mA is applied to the antifuse in a second direction for 1 ms. At soaking step 50, the sequence of steps 46 and 48 may be repeated up to four more times. Repeating the sequence of soaking steps 46 and 48 helps to reduce the distribution range of programmed antifuse resistances.

In the first and second embodiments described according to the present invention, the methods include a first low programming current of about 0.25 mA to about 0.5 mA followed by a higher soaking current of about 2 mA to about 5 mA. The method generally of a low programming current followed by higher soaking current provides a relatively lower and tighter distribution of antifuse resistance than a high programming current of about 2 mA to about 5 mA followed by a high soaking current of about 2 mA to about 5 mA.

According to the present invention, current pulses of a particular duration and magnitude are applied to the electrodes of an antifuse during the programming process. In an integrated circuit die, the antifuses are not directly accessible from outside of the integrated circuit. The antifuses in the integrated circuit are selected for programming and accessed by a number of known schemes, which generally include first providing the integrated circuit with information identifying the antifuse to be programmed. This information is transformed by circuitry in the integrated circuit into signals which provide a programming path to the antifuse to be programmed.

In the programming set-up, a programming path from I/O pins of the integrated circuit to the antifuse is created by addressing circuitry. Selection circuitry is connected via I/O pins to addressing circuitry located in the integrated circuit. This programming path includes MOS transistors that are turned on by addressing circuitry to complete the programming path from a programming pulse generator to antifuse. Those of ordinary skill in the art will recognize that the programming set-up described is oversimplified for the purpose of showing the environment of the present invention without overcomplicating the disclosure. Such skilled persons are familiar with addressing programmable devices and will have no trouble comprehending the invention from the disclosure herein.

The programming device is connected to I/O pins of the integrated circuit to complete the programming path to its internal antifuses. Details of product use vary by manufacturer, but those of ordinary skill in the art recognize that full information on the use of such devices is provided by the manufacturers. It should be appreciated that providing the apparatus for providing such programming pulses is well within the level of skill of those of ordinary skill in that particular art. Accordingly, a detailed description of the apparatus for proving the pulses according to the method of the present invention is not described herein. A programming device suitable for use includes an antifuse programming system available from Actel Corporation of Sunnyvale, Calif., such as Activator or Sculptor.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for programming an antifuse having a first electrode and a second electrode including steps of:

applying a first programming pulse of about 0.25 mA to about 0.5 mA to the first electrode of the antifuse; and applying a second programming pulse of about 0.25 mA to about 0.5 mA to the second electrode of the antifuse.

2. The method as in claim 1, wherein said first programming pulse and said second programming pulse are each applied for about 10 us.

3. The method as in claim 1, further including steps of:

applying a first soaking pulse of about 2 mA to about 5 mA to the first electrode of the antifuse; and applying a second soaking pulse of about 2 mA to about 5 mA to the second electrode of the antifuse; and repeating the steps of applying said first soaking pulse and applying said second soaking pulse at least once.

4. The method as in claim 3, wherein said first programming pulse and said second programming pulse are applied for about 10 us, and said first soaking pulse and said second soaking pulse are applied for about 1 ms.

5. The method as in claim 1, wherein said steps of applying a first programming pulse and applying a second programming pulse are repeated at least four more times.

6. The method as in claim 5, wherein said first programming pulse and said second programming pulse are applied for about 1 ms.

7. The method as in claim 5, further including steps of:

applying a first soaking pulse of about 2 mA to about 5 mA to the first electrode of the antifuse;

applying a second soaking pulse of about 2 mA to about 5 mA to the second electrode of the antifuse; and repeating the steps applying said first soaking pulse and applying said second soaking pulse at least once.

8. The method as in claim 7, wherein said first programming pulse and said second programming pulse are applied for about 1 ms, and said first soaking pulse and said second soaking pulse are applied for about 1 ms.

9. A method for programming an antifuse having a first electrode and a second electrode including steps of:

applying a first low current programming pulse to the first electrode of the antifuse;

applying a second low current programming pulse to the second electrode of the antifuse;

applying a first high current soaking pulse to the first electrode of the antifuse; and applying a second high current soaking pulse to the second electrode of the antifuse.

* * * * *